(12) United States Patent
Scheffler

(10) Patent No.: US 7,400,870 B2
(45) Date of Patent: Jul. 15, 2008

(54) HARDWARE LOOP FOR AUTOMATIC GAIN CONTROL

(75) Inventor: Bernd Scheffler, Munich (DE)

(73) Assignee: Texas Instruments Incorporated, Dallas, TX (US)

( * ) Notice: Subject to any disclaimer, the term of this patent is extended or adjusted under 35 U.S.C. 154(b) by 1040 days.

(21) Appl. No.: 10/021,360

(22) Filed: Oct. 30, 2001

(65) Prior Publication Data

US 2003/0083030 A1 May 1, 2003

(51) Int. Cl.
*H04B 1/06* (2006.01)

(52) U.S. Cl. ............... 455/245.1; 455/234.1; 455/232.1

(58) Field of Classification Search .............. 455/245.1, 455/232.1, 234.1, 250.1, 73, 127.2; 375/345
See application file for complete search history.

(56) References Cited

U.S. PATENT DOCUMENTS

| | | | | |
|---|---|---|---|---|
| 5,107,225 | A | * 4/1992 | Wheatley et al. | ............. 330/279 |
| 5,507,023 | A | * 4/1996 | Suganuma et al. | ........ 455/234.1 |
| 6,868,128 | B1 | * 3/2005 | Lane | ........................... 375/319 |
| 2002/0150174 | A1 | * 10/2002 | Spiegel et al. | ................ 375/316 |

FOREIGN PATENT DOCUMENTS

JP        05-244025        * 9/1993

* cited by examiner

*Primary Examiner*—Melur Ramakrishnaiah
(74) *Attorney, Agent, or Firm*—Dolly Y. Wu; W. James Brady; Frederick J. Telecky, Jr.

(57) ABSTRACT

A hardware control loop (19) derives an AGC setting for a communication receiver based on signal strength information (16), without incurring program execution delay of a baseband processor.

28 Claims, 3 Drawing Sheets

HARDWARE LOOP FOR AUTOMATIC GAIN CONTROL

FIELD OF THE INVENTION

The invention relates generally to reception of communication signals and, more particularly, to automatic gain control (AGC) in communication signal reception.

BACKGROUND OF THE INVENTION

In conventional (e.g., RF) communication receivers in TDMA systems, the actual RSSI (received signal strength indication) is determined, for example, during a specific period (training sequence) of a communication burst. The RSSI is reported to a DSP or microcontroller (i.e., the baseband processor), which executes a program that uses the RSSI to calculate the optimum AGC setting. This intervention by the microcontroller or DSP slows the process of setting the AGC. This is particularly disadvantageous in some situations.

For example, fast antenna diversity control at high ISN band frequencies (above 2 GHz) can be very advantageous. A slow AGC setting process impedes fast antenna diversity control. As another example, in license free bands, there is typically a need for high receiver linearity. One factor in achieving high receiver linearity is an optimum AGC setting. However, because an optimum AGC is required, the process of setting the AGC is further slowed.

Also, the time required for the baseband processor to receive the RSSI information, execute the program to determine the new AGC setting, and report the new AGC setting to the RF front end (e.g. via a serial interface) is so long that the new AGC setting is not available to the RF front end (in the best case) until the next communication burst. This is particularly disadvantageous when the communication involves real time data streaming.

It is therefore desirable to provide for a faster AGC setting than is conventionally available with baseband processor intervention.

According to the invention, a hardware control loop derives the AGC setting from signal strength information without incurring program execution delay of the baseband processor. This advantageously reduces the time required to set the AGC.

DETAILED DESCRIPTION

Figure 1:
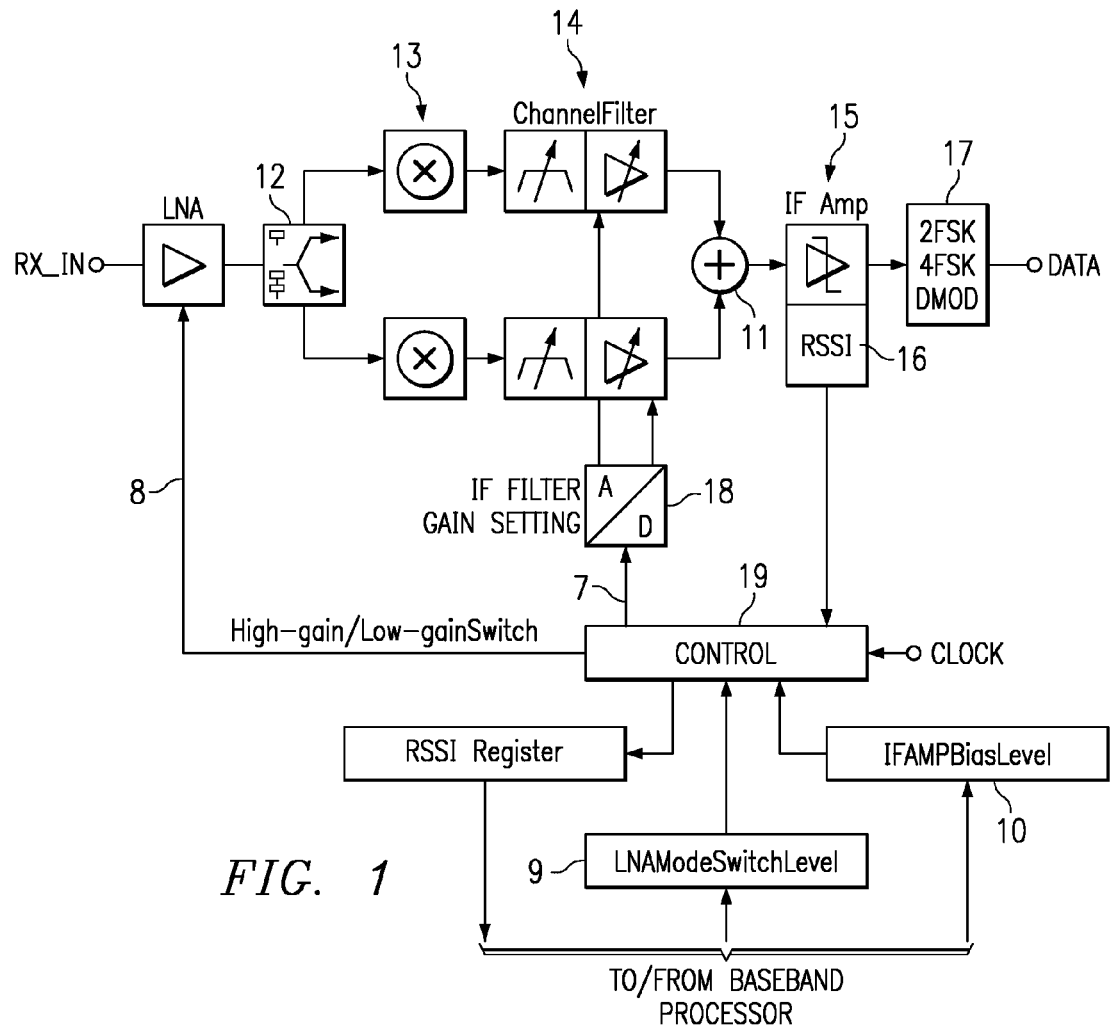
FIG. 1 diagrammatically illustrates pertinent portions of exemplary embodiments of an RF receiver according to the invention.

FIG. 1 diagrammatically illustrates pertinent portions of exemplary embodiments of an RF communication receiver according to the invention. As shown in FIG. 1, the received signal RX_IN is input to an LNA (low noise amplifier) whose output is applied to a phase splitter 12. The in-phase and quadrature signals provided by the phase splitter 12 are applied to IF mixers at 13. These mixers mix the RF signal down into the IF range. The IF signals output from the mixers at 13 are then applied to respective channel filters 14. These channel filters include filter portions and amplifier portions as shown in FIG. 1. The amplifier portions include control inputs for setting the filter gain of the channel filters. The outputs of the channel filters are combined at 11 and applied to an IF amplifier 15 whose output drives a demodulator 17 which can employ, for example, 2 FSK or 4 FSK demodulation. The IF amplifier 15 is capable of providing an RSSI measurement at 16.

All of the above described components of FIG. 1 are well-known in the art and can be readily combined in conventional fashion to implement the structure illustrated at 11-17 in FIG. 1.

FIG. 1 further includes a control portion 19 which implements a hardware control loop according to the invention. The hardware control loop receives RSSI information from the IF amplifier at 16, and provides in response thereto a high/low gain switching signal 8 for switching the LNA between low gain operation and high gain operation. The logic control portion 19 also provides at 7 a digital signal which is converted into analog format by an D/A converter 18 whose output provides a filter gain control signal to the amplifiers of the channel filters. The logic control portion 19 receives from the baseband processor information at 10 indicative of the desired bias level of the IF amplifier 15, and also receives from the baseband information at 9 indicative of a threshold power level above which the LNA should be switched to low gain operation and below which the LNA should be switched to high gain operation. The logic control portion 19 also provides to the baseband processor the RSSI information received at 16 from the IF amplifier 15. The baseband processor can also perform other well-known conventional functions in support of the communication operation of the receiver of FIG. 1.

According to exemplary embodiments of the invention, the logic control portion 19 compares the RSSI measurement from the IF amplifier to the desired bias level of the IF amplifier, and uses the deviation of the RSSI measurement relative to the bias level to update the channel filter gain. The logic control portion 19 also estimates the total front end RF power based on the RSSI measurement and the actual front end gain setting, which gain setting includes the current channel filter gain and the current LNA gain. This estimated total front end power is used in combination with the threshold power level information received from the baseband processor to decide whether or not to update the LNA gain setting from low to high or high to low.

The above-described operations in support of updating the channel filter gain and LNA gain are repeated, in some embodiments, until one of the following occurs: (1) the total variable gain, obtained by adding the LNA gain to the channel filter gain, reaches a predetermined upper or lower limit; or (2) the aforementioned deviation of the RSSI measurement relative to the desired bias level is within a predetermined range. If either (1) or (2) above occurs, the current LNA gain and the current channel filter gain are accepted and the control loop is frozen until receipt of the next communication burst.

Figure 2:
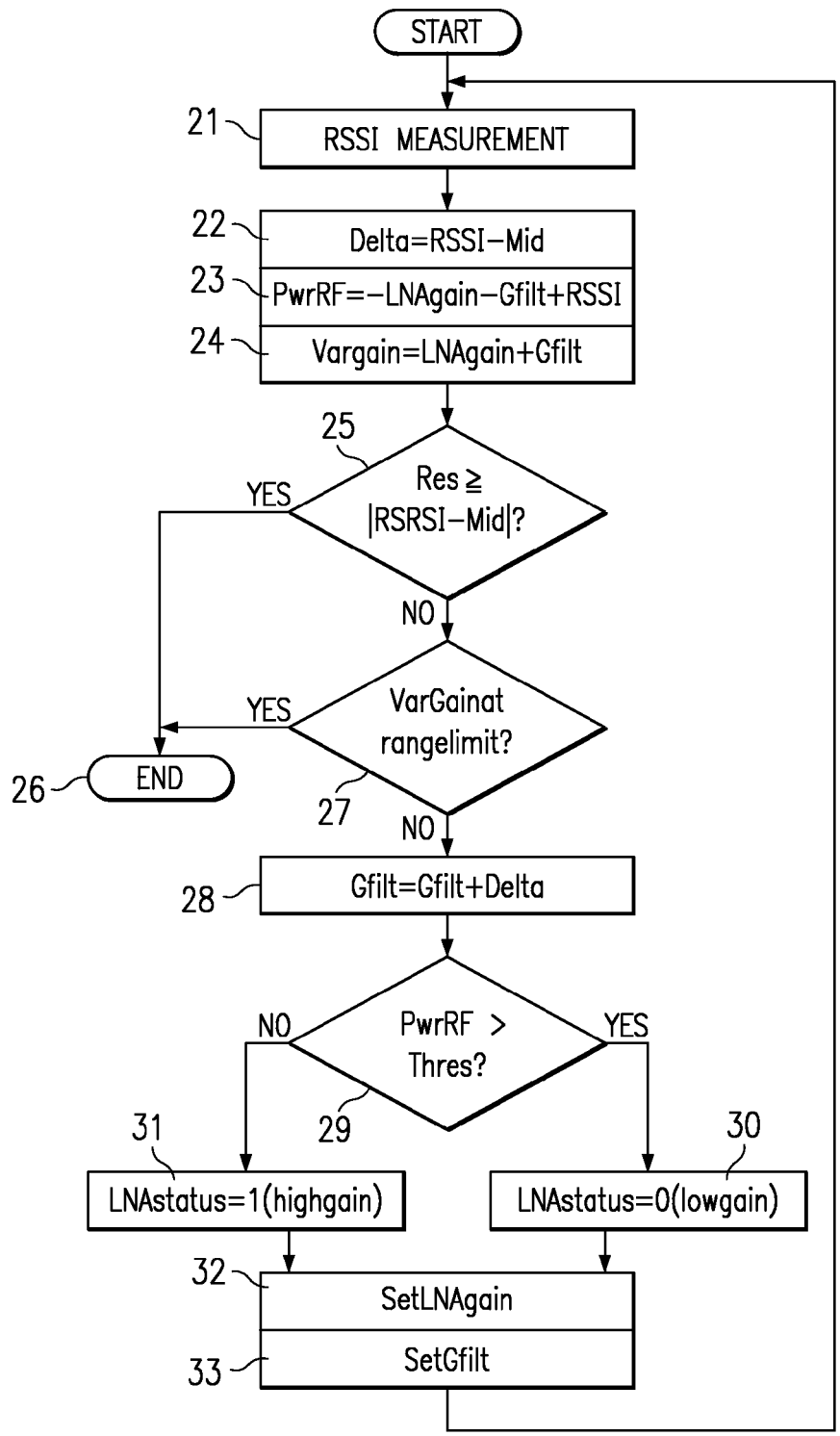
FIG. 2 illustrates exemplary operations which can be performed by the control loop of FIG. 1.

FIG. 2 illustrates the above-described AGC operations according to the invention. At 21, the RSSI measurement is obtained from the register 16 (see also FIG. 1). At 22, the deviation (Delta) of the RSSI measurement relative to the desired bias level is obtained by subtracting the desired bias level (Mid) from the RSSI level. At 23, the front end power (PwrRF) is estimated by subtracting the channel filter gain (Gfilt) and the LNA gain from the RSSI level. At 24, the total variable gain (Vargain) is calculated by adding the channel filter gain to the LNA gain.

At 25, if Delta (RSSI−Mid) has an absolute value less than or equal to a maximum allowed limit (Res), then the AGC operations end at 26. Otherwise, it is determined at 27 whether the total variable gain is at the upper or lower limit of a selected range. If so, then the AGC operations end at 26. Otherwise, the channel filter gain is updated at 28 by adding Delta to the current channel filter gain to obtain the new (updated) channel filter gain. At 29, the estimated front end power is compared to the threshold power level. If the front end power exceeds the threshold level, then an LNA status bit is set to 0 at 30, thereby indicating that a low LNA gain level has been selected. If the front end power does not exceed the threshold level at 29, then the LNA status bit is set to 1 at 31, thereby indicating that a high LNA gain level has been selected. At 32, the LNA status bit is used to set the LNA gain, and at 33, the new channel filter gain is updated to the channel filter.

The above-described operations at 21-33 are repeated until the absolute value of Delta is within the limit Res, or until the total variable gain reaches the upper or lower limit of its range.

Figure 3:
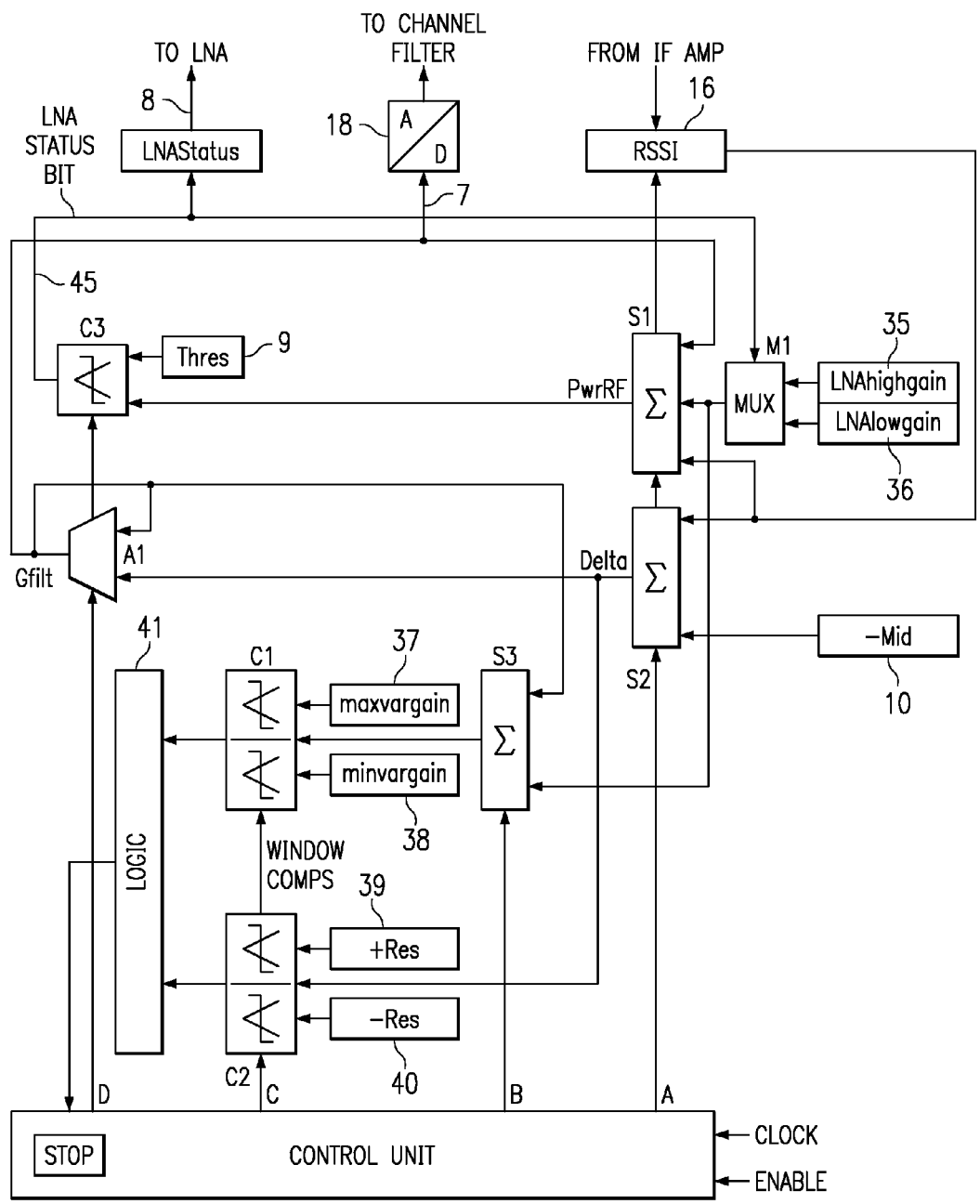
FIG. 3 diagrammatically illustrates exemplary embodiments of the control loop of FIG. 1.

FIG. 3 diagrammatically illustrates exemplary embodiments of the logic control portion 19 of FIG. 1. The logic control loop of FIG. 3 can perform the exemplary operations illustrated in FIG. 2. The RSSI measurement information from RSSI register 16 is input to a summing gate S1 and a summing gate S2. The desired bias level Mid for the IF amplifier is input to the summing gate S2 from the bias level register 10. The summing gate SI also receives the output of a multiplexer M1 which selects either a high LNA gain level value or a low LNA gain level value from a pair of registers 35 and 36. The summing gate S1 also receives as input the current channel filter gain value Gfilt. The multiplexer M1 is controlled by the LNA status bit. The summing gate S2 performs the operation at 22 in FIG. 2, and the summing gate S1 performs the operation at 23 in FIG. 2.

The output of multiplexer M1 is also input to a summing gate S3, along with the current value of the channel filter gain Gfilt. The summing gate S3 performs the operation illustrated at 24 in FIG. 2. The output of summing gate S3 is applied to a window comparator C1, along with an upper limit value for the variable gain (maxvargain) from register 37 and a lower limit value for the variable gain (minvargain) from register 38. The comparator C1 outputs a logic 1 if the output of summing gate S3 has reached either the upper limit in register 37 or the lower limit in register 38, and otherwise outputs a logic 0. The value of Delta is applied to a window comparator C2, along with values of +Res and −Res which are respectively provided by registers 39 and 40. The window comparator C2 outputs a logic 1 if the value of Delta is within +Res and −Res inclusive, and otherwise outputs a logic 0. A logic gate 41, for example an OR gate, determines whether either of the window comparators C1 and C2 has output a logic 1. If so, the logic gate 41 outputs a logic 1, which signals a control unit to freeze the control loop until the next communication burst is received. If the logic gate 41 outputs a logic 0, then the hardware control loop continues operation. It can therefore be seen that window comparators C1 and C2, gate 41 and the control unit perform the operations illustrated at 25-27 of FIG. 2.

The value of Delta is also input to an accumulator A1 whose output is the channel filter gain Gfilt. This channel filter gain is fed back as a second input to the accumulator A1. Thus, the accumulator A1 can perform the operation illustrated at 28 in FIG. 2. The accumulator A1 can incorporate a limiter that prevents the value of Gfilt from exceeding desired positive and negative limits.

The estimated front end power PwrRF is input to a window comparator C3 which compares this value to the threshold power level provided in register 9. The output 45 of comparator C3 is the LNA status bit described above. Thus, the comparator C3 can perform the operations illustrated at 29-31 of FIG. 2.

In the example of FIG. 3, the summing gates S1 and S2 are operable and the RSSI register 16 is read during a first clock cycle designated by A, the summing gate S3 is operable during a second clock cycle designated by B, the comparators C1 and C2 are operable during a third clock cycle designated by C, and the accumulator A1 and the comparator C3 are operable during a fourth clock cycle designated by D. In some embodiments, the clock cycles A, B, C and D are consecutive clock cycles which occur in the timewise order A, B, C, D. In other exemplary embodiments, the operations of all of the summing gates S1-S3 and the read of register 16 can be performed during clock cycle B, where clock cycle C immediately follows clock cycle B and clock cycle D immediately follows clock cycle C.

The values in the registers at 9, 10 and 35-40 can be provided by the baseband processor, for example via a serial interface, while the receiver is being initialized for operation. These values can be determined, for example, empirically from experimentation under expected operating conditions.

Assuming an RSSI dynamic range of 20 dB or more (which is common), the control loop of FIG. 3 realizes a quickly converging AGC algorithm. For example, only four or five clock cycles may be necessary to cover an 80 dB dynamic input level range. This is well within the time occupied by a training sequence of a communication burst, so the AGC is set before the payload bits of the burst are transmitted. Such a quickly convergent control loop can advantageously provide a high intermodulation free dynamic range, resulting in increased system robustness to interfering signals, which can be important in license free bands. The quick convergence also advantageously permits fast antenna diversity control for low cost (and/or fast moving) systems. Finally, because the AGC algorithm is implemented entirely in a hardware loop without participation by the baseband processor, neither baseband processing power nor user software development are necessary to implement the AGC.

Although exemplary embodiments of the invention are described above in detail, this does not limit the scope of the invention, which can be practiced in a variety of embodiments.

What is claimed is:

1. An automatic gain control apparatus, comprising:
    a first input for receiving from a communication receiver information indicative of signal strength of a received communication signal;
    hardware coupled to said first input and responsive to said signal strength information for determining an automatic gain control setting for the communication receiver without incurring program execution delay of a data processor; and
    the communication receiver comprising dual channels, each having a channel filter circuit with a gain adjustable by said hardware, wherein a gain adjustment is conducted in the channel filter circuit itself.

2. The apparatus of claim 1, wherein the communication receiver is a TDMA RF receiver.

3. The apparatus of claim 1, wherein said signal strength information includes an RSSI signal derived from an amplifier portion of the communication receiver.

4. The apparatus of claim 1, including a second input for receiving information indicative of a desired bias level of an amplifier of the communication receiver, said hardware coupled to said second input and also responsive to said bias level information for determining the automatic gain control setting without incurring program execution delay of a data processor.

5. The apparatus of claim 4, wherein said hardware includes difference circuitry responsive to said bias level information and said signal strength information for determining therefrom a deviation value indicative of a difference between said bias level and said signal strength.

6. The apparatus of claim 5, wherein said hardware includes range checking circuitry coupled to said difference circuitry for determining whether the deviation value is within a predetermined range.

7. An automatic gain control apparatus, comprising:
a first input for receiving from a communication receiver information indicative of signal strength of a received communication signal;
hardware coupled to said first input and responsive to said signal strength information for determining an automatic gain control setting for the communication receiver without incurring program execution delay of a data processor;
a second input for receiving information indicative of a desired bias level of an amplifier of the communication receiver, said hardware coupled to said second input and also responsive to said bias level information for determining the automatic gain control setting without incurring program execution delay of a data processor;
wherein said hardware includes difference circuitry responsive to said bias level information and said signal strength information for determining therefrom a deviation value indicative of a difference between said bias level and said signal strength; and
wherein said hardware includes filter gain circuitry coupled to said difference circuitry for determining in response to said deviation value a filter gain for a channel filter of the communication receiver.

8. The apparatus of claim 7, wherein said hardware includes an output coupled to said filter gain circuitry for outputting to the communication receiver information indicative of said filter gain.

9. The apparatus of claim 7, said apparatus including a third input for receiving information indicative of a gain value selected for an LNA of the communication receiver, said hardware coupled to said third input and also responsive to said LNA gain value for determining said automatic gain control setting without incurring program execution delay of a data processor.

10. The apparatus of claim 9, wherein said hardware includes a summing circuit coupled to said third input and said filter gain circuitry for adding said filter gain value to said LNA gain value to produce a total gain value.

11. The apparatus of claim 10, wherein said hardware includes a range checking circuit coupled to said summing circuit for detecting whether said total gain value has reached a predetermined gain limit value.

12. The apparatus of claim 11, wherein said range checking circuit is further operable for detecting whether said total gain value has reached either of an upper gain limit or a lower gain limit.

13. An automatic gain control apparatus, comprising:
a first input for receiving from a communication receiver information indicative of signal strength of a received communication signal;
hardware coupled to said first input and responsive to said signal strength information for determining an automatic gain control setting for the communication receiver without incurring program execution delay of a data processor;
a second input for receiving information indicative of a predetermined power level value, said hardware coupled to said second input and also responsive to said power level information for determining said automatic gain control setting without incurring program execution delay of a data processor; and
wherein said predetermined power level value is a threshold value, and wherein said hardware includes compare circuitry for comparing said threshold value with an estimated total power of the communication receiver to select an LNA gain setting for the communication receiver.

14. The apparatus of claim 13, including an output coupled to said compare circuitry and responsive thereto for outputting to the communication receiver information indicative of the selected LNA gain.

15. The apparatus of claim 13, including a second input for receiving information indicative of a predetermined power level value, said hardware coupled to said second input and also responsive to said power level information for determining said automatic gain control setting without incurring program execution delay of a data processor.

16. An automatic gain control apparatus, comprising:
a first input for receiving from a communication receiver information indicative of signal strength of a received communication signal;
hardware coupled to said first input and responsive to said signal strength information for determining an automatic gain control setting for the communication receiver without incurring program execution delay of a data processor; and
a second input for receiving information indicative of a gain value selected for an LNA of the communication receiver, said hardware coupled to said second input and also responsive to said LNA gain value for determining said automatic gain control setting without incurring program execution delay of a data processor.

17. The apparatus of claim 16, including a third input for receiving information indicative of a further gain value selected for the LNA of the communication receiver, said hardware coupled to said third input and also selectively responsive to one of said LNA gain values for determining said automatic gain control setting without incurring program execution delay of a data processor.

18. A communication receiver apparatus, comprising:
an LNA;
a receiver portion for receiving and processing communication signals;
a control portion for determining an automatic gain control setting for said receiver portion, said control portion including a first input coupled to said receiver portion for receiving therefrom information indicative of signal strength of a received communication signal, said control portion further including hardware coupled to said first input and responsive to said signal strength information for determining said automatic gain control setting without incurring program execution delay of a data processor; and
wherein said control portion includes a second input for receiving information indicative of a gain value selected for said LNA of the communication receiver, said hardware coupled to said second input and also responsive to said LNA gain value for determining said automatic gain control setting.

19. The apparatus of claim 18, provided as an RF communication receiver apparatus.

20. The apparatus of claim 18, wherein said signal strength information includes an RSSI signal.

21. The apparatus of claim 20, wherein said receiver portion includes an amplifier which produces said RSSI signal.

22. The apparatus of claim 18, wherein said control portion includes a second input for receiving information indicative of a desired bias level of an amplifier of the communication receiver, said hardware coupled to said second input and also responsive to said bias level information for determining the automatic gain control setting without incurring program execution delay of a data processor.

23. The apparatus of claim 18, wherein said control portion includes a second input for receiving information indicative of a predetermined power level value, said hardware coupled to said second input and also responsive to said power level information for determining said automatic gain control setting without incurring program execution delay of a data processor.

24. An automatic gain control method involving a filter circuit, comprising:

providing information indicative of signal strength of a communication signal received by a communication receiver;

responsive to said signal strength information, determining an automatic gain control setting for the communication receiver without incurring program execution delay of a data processor; and adjusting filter gain settings of dual channels of the communication receiver, wherein gain settings are in the filter circuit itself.

25. The method of claim 24, including performing said determining step also in response to information indicative of a desired bias level of an amplifier of the communication receiver.

26. The method of claim 24, including performing said determining step also in response to information indicative of a predetermined power level value.

27. The method of claim 24, including performing said determining step also in response to information indicative of a gain value selected for an LNA of the communication receiver.

28. The method of claim 24, further comprising the step of implementing the automatic gain control method in a TDMA system.

* * * * *